(12) United States Patent
Enjalbert

(10) Patent No.: US 9,753,064 B2
(45) Date of Patent: Sep. 5, 2017

(54) METHOD AND APPARATUS FOR METERING A VOLTAGE SIGNAL

(71) Applicant: Jerome Enjalbert, Fonsorbes (FR)

(72) Inventor: Jerome Enjalbert, Fonsorbes (FR)

(73) Assignee: NXP USA, Inc., Austin, TX (US)

(*) Notice: Subject to any disclaimer, the term of this patent is extended or adjusted under 35 U.S.C. 154(b) by 121 days.

(21) Appl. No.: 14/785,635

(22) PCT Filed: Apr. 22, 2013

(86) PCT No.: PCT/IB2013/001150
§ 371 (c)(1),
(2) Date: Oct. 20, 2015

(87) PCT Pub. No.: WO2014/174334
PCT Pub. Date: Oct. 30, 2014

(65) Prior Publication Data
US 2016/0061867 A1    Mar. 3, 2016

(51) Int. Cl.
*G01N 27/416* (2006.01)
*G06G 7/12* (2006.01)
*G01R 19/22* (2006.01)
*G01R 31/36* (2006.01)
*G01R 19/25* (2006.01)

(52) U.S. Cl.
CPC ......... *G01R 19/22* (2013.01); *G01R 19/2509* (2013.01); *G01R 31/361* (2013.01); *G01R 31/362* (2013.01)

(58) Field of Classification Search
CPC .. G01R 19/22; G01R 19/2509; G01R 31/361; G01R 31/362; H01C 7/13
USPC ........................................................ 324/426
See application file for complete search history.

(56) References Cited

U.S. PATENT DOCUMENTS

| 5,867,054 A | 2/1999 | Kotowski |
| 7,358,743 B2 | 4/2008 | Miaille |
| 2010/0244845 A1 | 9/2010 | Morikawa et al. |

OTHER PUBLICATIONS

International Search Report and Written Opinion correlating to PCT/IB2013/001150 issued on Jan. 17, 2014.

*Primary Examiner* — M'Baye Diao
(74) *Attorney, Agent, or Firm* — Charlene R. Jacobsen

(57) ABSTRACT

A voltage metering module for metering a voltage signal at least one analogue to digital converter (ADC) component arranged to receive at an input thereof a voltage signal and to generate a digital signal representative of the received voltage signal. The at least one ADC component includes at least one sampling network controllable to sample the received voltage signal for conversion to a digital signal representative of the received voltage signal and at least one compensation network operably coupled in parallel with the sampling network and controllable to sample the received voltage signal such that an input current of the compensation network at least partially compensates for a component of an input current of the sampling network.

19 Claims, 9 Drawing Sheets

METHOD AND APPARATUS FOR METERING A VOLTAGE SIGNAL

FIELD OF THE INVENTION

This invention relates to a method and apparatus for metering a voltage signal, and in particular to a voltage metering module and method therefor.

BACKGROUND OF THE INVENTION

In the field of battery powered electronic devices such as mobile communication devices and the like, power management is an important feature and is often provided by way of a dedicated power management integrated circuit (PMIC) device. A key component of such a PMIC device is battery state-of-charge functionality, which tracks current entering and leaving the battery (e.g. by way of a Coulomb counter), and based on this information is able to estimate the stage-of-charge for the battery. Such state-of-charge functionality allows, for example, the remaining talk time and standby time in hours and minutes of a mobile communication device to be predicted.

The Coulomb counter is used to integrate the current drawn from or injected into the battery to yield the status of the battery charge. The output of the Coulomb counter may be processed by software together with, say, battery age, temperature, battery voltage, indication of full re-charge by charger, and a number of charge/discharge cycles to estimate the remaining capacity of the battery. The Coulomb counter is required to have a very low current consumption due to it having to always be 'on', which restricts the sampling and operating frequency of the converter. Nevertheless, the Coulomb counter component is also required to capture fast input transients.

FIG. 1 illustrates an example of a conventional implementation for a Coulomb counter 100 used as part of a battery state-of-charge functionality within a PCIM device 105. The voltage (Vsns_diff) across a sense resistor 110 is filtered using a single pole RC filter, which provides a form of 'memory' that enables the fast input transients to be captured whilst enabling a sampling and operating frequency of the Coulomb counter to be kept low. In the illustrated example, the RC filter is implemented by way of an external capacitor 120 and internal resistances 130, 135. The filtered voltage is then provided to, for example, a first order incremental converter 140 using, for example, switched capacitor technology (not shown) clocked with the RTC (real time clock) of the electronic device (e.g. 32 KHz).

A high resolution is required for the converter 140, which is achieved by a large oversampling ratio:

$$\frac{conversions\_cycle\_frequency}{input\_signal\_bandwidth} \approx 10,000 \Rightarrow$$   [Equation 1]

$$LPF\_cutt-off\_frequency \approx 1.6 \text{ Hz}$$

The use of an external capacitor 120 means that its size is restricted by PCB (printed circuit board) constraints. Accordingly, in order for the RC filter to achieve the required input signal bandwidth, the internal resistances 130, 135 have to be sufficiently large to compensate for the limited size of capacitance ($f=1/(2.pi.R.C)$); e.g. $R=2 \times 500K$, $C=100$ nF.

For the next generation of devices, external components (i.e. the capacitance 120) are required to be much reduced or removed, but the converter bandwidth cannot be increased too much due to current consumption constraints. Consequently, the integrated resistors 130, 135 will be required to be significantly larger to compensate for the reduction or removal of the external capacitance 120, while keeping the cut-off frequency for the input low pass filter approximately the same, which is necessary to avoid increasing the converter bandwidth. However, the required high value input resistances result in the filter introducing a differential input voltage error as large as 100 times the required resolution. Such a large differential input voltage error introduces a prohibitively large gain error into the Coulomb counter.

SUMMARY OF THE INVENTION

The present invention provides a voltage metering module, a battery state-of-charge module and an integrated circuit device comprising such a voltage metering module and a method of metering a voltage signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
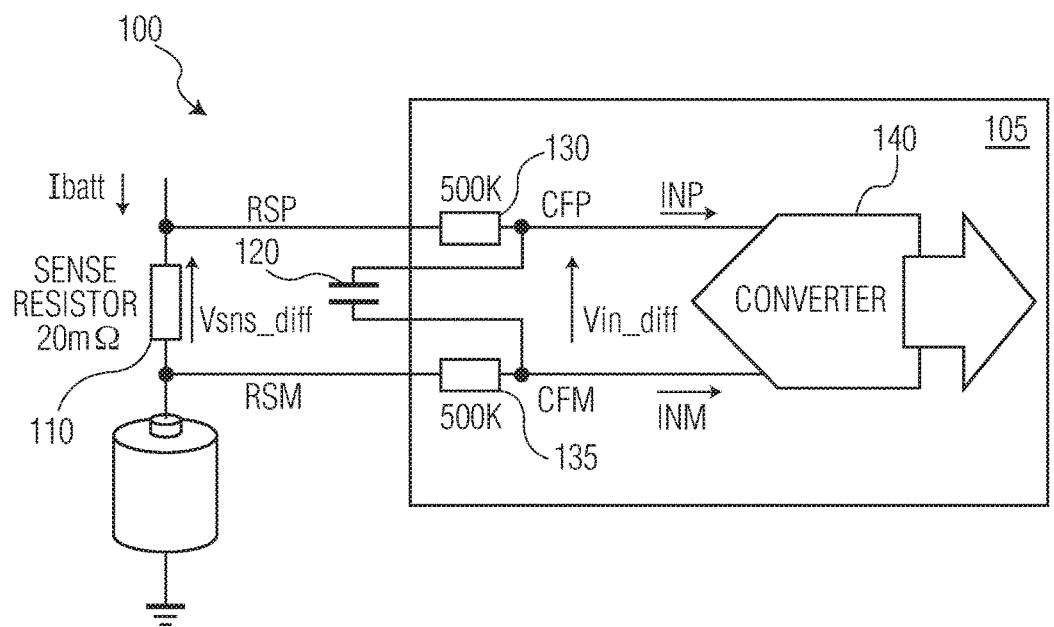
FIG. 1 illustrates an example of a conventional implementation for a Coulomb counter.

The present invention will now be described with reference to the accompanying drawings in which an example of a voltage metering module forming part of a Coulomb counter for enabling battery state-of-charge functionality within a power management integrated circuit (PMIC) device, and a method of metering voltage therefor are illustrated and described. However, it will be appreciated that the present invention is not limited to the specific examples herein described and illustrated in the accompanying drawings. In particular, it is contemplated that alternative examples of the present invention comprising voltage metering modules and/or methods of metering voltage may equally be implemented within alternative applications requiring the metering of voltage and/or current flow. In addition, although the present invention has been herein described with reference to a voltage metering module arranged to receive at an input thereof a differential voltage signal and to generate a digital signal representative of the received differential voltage signal, it will be appreciated that the present invention is not limited to a voltage metering module arranged to receive differential input voltage signal, and may equally be implemented within a voltage metering module arranged to receive a non-differential, single-ended input voltage signal.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

According to some examples of a first aspect of the present invention, there is provided a voltage metering module for metering a voltage signal. The voltage metering module comprises at least one analogue to digital converter, ADC, component arranged to receive at an input thereof a voltage signal and to generate a digital signal representative of the received voltage signal. The at least one ADC component comprises at least one sampling network controllable to sample the received voltage signal for conversion to a digital signal representative of the received voltage signal, at least one compensation network operably coupled in parallel with the sampling network and controllable to sample the received voltage signal such that an input current of the compensation network at least partially compensates for a component of an input current of the sampling network.

In this manner, by providing such a compensation network that compensates for a component of an input current of the sampling network, the systematic input current of the input of the ADC converter may be reduced, thereby reducing any input voltage error ($e_{VIN}$) caused by such current flowing through filter resistances.

In one optional embodiment, the at least one compensation network may be arranged to sample the received voltage signal simultaneously with the sampling network sampling the received voltage signal.

In one optional embodiment, the ADC component may comprise a first switching arrangement controllable to selectively couple an input of the sampling network to one of:
  (i) the voltage signal received at the input of the ADC component; and
  (ii) a first reference voltage signal, wherein the first switching arrangement may be arranged to operably couple the input of the sampling network to the voltage signal received at the input of the ADC component when the ADC component is in a first operational phase, and operably couple the input of the sampling network to the first reference voltage signal when the ADC component is in a second operational phase.

In one optional embodiment, the first switching arrangement may be controllable to selectively configure a polarity of the first reference voltage signal.

In one optional embodiment, the first switching arrangement may be controllable to selectively configure the polarity of the first reference voltage signal based at least partly on a logical state of a digital signal representative of an integrated sampled voltage signal.

In one optional embodiment, the first reference voltage may comprise a differential voltage signal.

In one optional embodiment, the first reference voltage may be centred about a common-mode voltage of the received voltage signal.

In one optional embodiment, the ADC component may comprise at least one further switching component controllable to selectively couple an input of the compensation network to one of:
  (i) the voltage signal received at the input of the ADC component; and
  (ii) at least one further reference voltage signal, wherein the at least one further switching arrangement may be arranged to operably couple the input of the compensation network to the voltage signal received at the input of the ADC component when the ADC component is in a first operational phase and operably couple the input of the compensation network to the at least one further reference voltage signal when the ADC component is in a second operational phase.

In one optional embodiment, the at least one further reference voltage signal may comprise a magnitude three times the magnitude of the first reference voltage signal.

In one optional embodiment, the at least one further switching arrangement may be controllable to selectively configure a polarity of the at least one further reference voltage signal.

In one optional embodiment, the at least one further switching arrangement may be controllable to selectively configure the polarity of the at least one further reference voltage signal based at least partly on a logical state of a digital signal representative of an integrated sampled voltage signal.

In one optional embodiment, the ADC component may further comprise an integrator component arranged to perform integration of the received voltage signals sampled by the sampling network to generate an integrated sampled voltage signal.

In one optional embodiment, the at least one sampling network may be configurable to operate in a first, sampling mode in which the sampling network samples the received voltage signal, and a second, integration mode in which the sampled voltage signal is provided to the integrator component.

In one optional embodiment, the at least one compensation network may be controllable to operate in a sampling mode equivalent to the sampling mode of the at least one sampling network.

In one optional embodiment, the ADC component may further comprise a comparator component arranged to receive the integrated sampled voltage signal generated by the integrator component, and to output a digital signal based at least partly on the received integrated sampled voltage signal.

In one optional embodiment, the voltage metering module may comprise at least one resistance/capacitance, RC, filter component arranged to perform filtering of a voltage signal to be metered, and the at least one analogue to digital converter, ADC, component is arranged to receive the filtered voltage signal at the input thereof and to generate a digital signal representative of the filtered voltage signal.

In one optional embodiment, the voltage metering module may comprise a sense resistance operably coupled in series with a current flow path and arranged to generate a voltage signal to be metered there across representative of a current flow through the current flow path.

In one optional embodiment, the ADC component may be arranged to receive at an input thereof a differential voltage signal and to generate a digital signal representative of the received differential voltage signal. Furthermore, the at least one ADC component may comprise at least one sampling network controllable to sample the received differential voltage signal for conversion to a digital signal representative of the received differential voltage signal, and at least one compensation network operably coupled in parallel with the sampling network and controllable to sample the received differential voltage signal such that an input current of the compensation network at least partially compensates for a differential component of an input current of the sampling network.

According to some examples of a second aspect of the present invention, there is provided a battery state-of-charge module comprising at least one voltage metering module according to the first aspect of the present invention.

According to some examples of a third aspect of the present invention, there is provided an integrated circuit device comprising at least one voltage metering module according to the first aspect of the present invention.

According to some examples of a fourth aspect of the present invention, there is provided a method of metering a voltage signal. The method comprises performing a first sampling of a voltage signal for conversion to a digital signal representative of the sampled voltage signal, and performing at least one further sampling of the voltage signal such that an input current of the at least one further sampling of the voltage signal at least partially compensates for a input current of the first sampling of the voltage signal.

Figure 2:
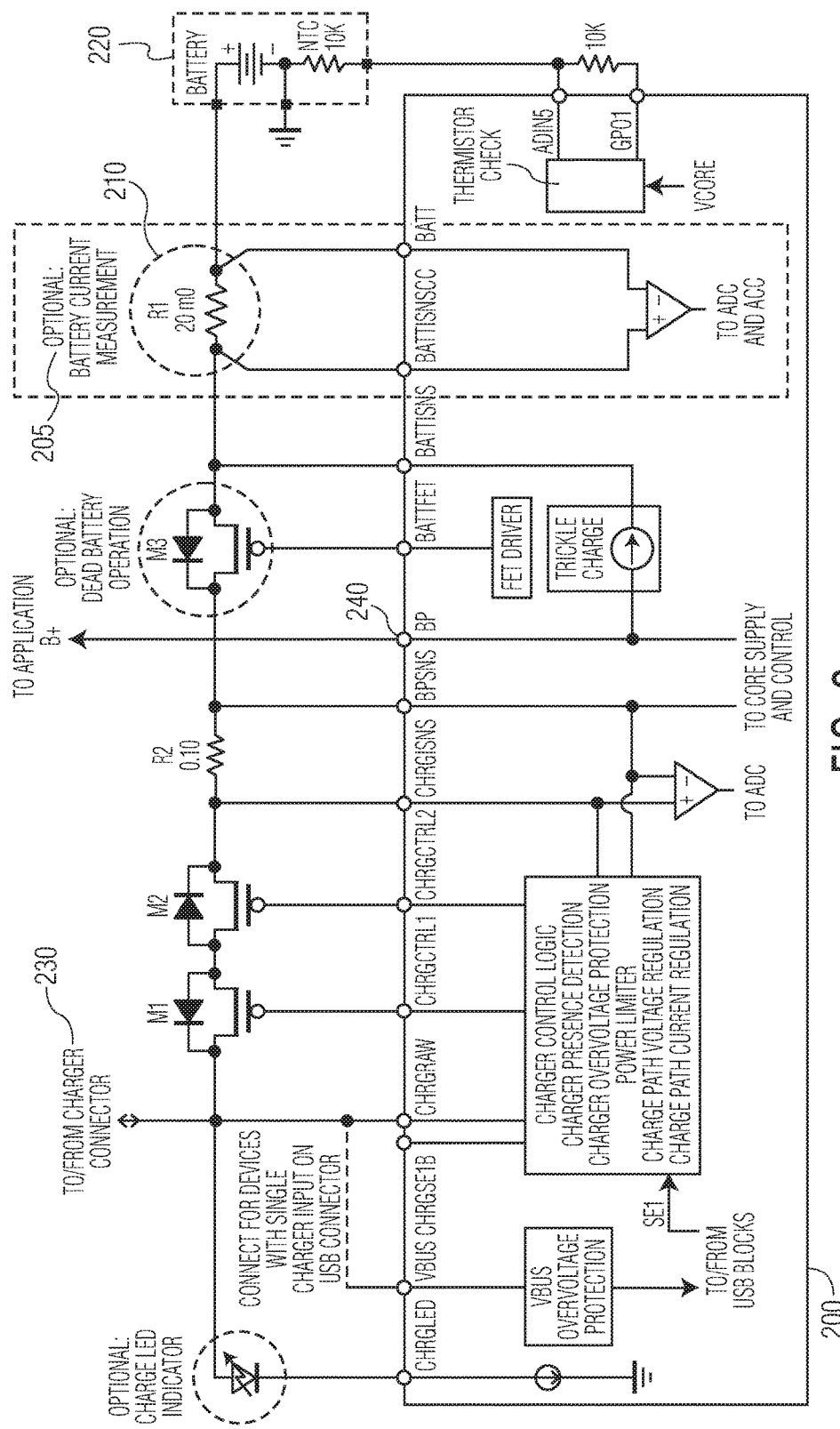
FIG. 2 illustrates a simplified block diagram of an example of a power management integrated circuit (PMIC) device.

Referring now to FIG. 2, there is illustrated a simplified block diagram of an example of a power management integrated circuit (PMIC) device 200 comprising battery state-of-charge functionality comprising a Coulomb counter 205. The Coulomb counter 205 comprises a sense resistance 210 operably coupled in series between a battery 220 and one or more applications/devices (not shown) to be powered by the battery 220. The sense resistance 210 is also operably coupled between the battery 220 and a battery charger connector 230. In this manner, the sense resistance 210 is operably coupled in series with a current flow path for current entering and leaving the battery 220. As such, current entering and leaving the battery 210 flows through the sense resistance 210, which converts such current flow into a voltage signal across the resistance 210. As described in greater detail below for example with reference to FIG. 3, the Coulomb counter 205 further comprises a voltage metering module arranged to meter the voltage signal across the resistance 210, and thus of the charge flow through the sense resistance 210. The metered charge flow may then be processed by software together with, say, battery age, temperature, battery voltage, indication of full re-charge by charger, and a number of charge/discharge cycles to estimate the remaining capacity of the battery.

Figure 3:
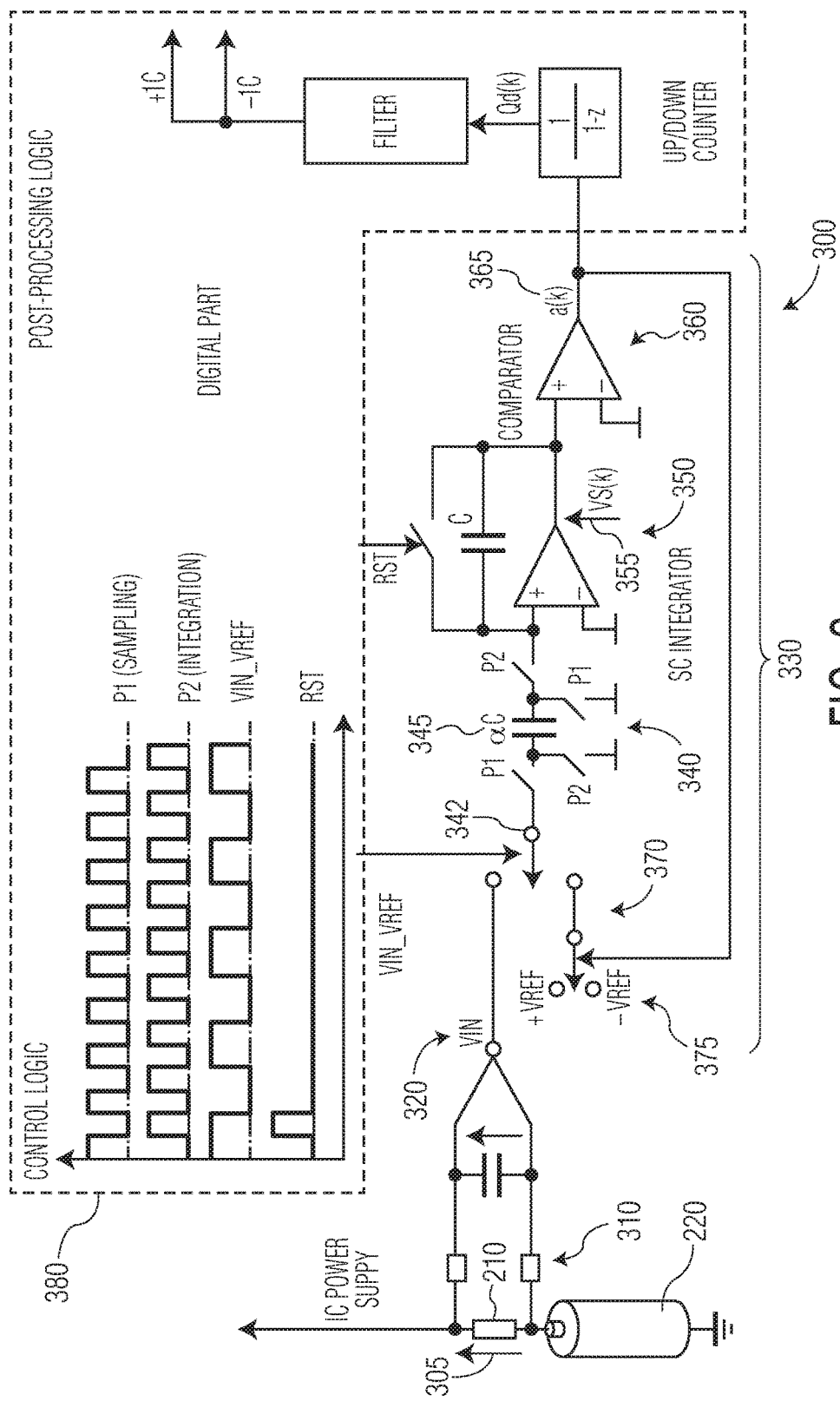
FIG. 3 illustrates a simplified block diagram of an example of a part of a Coulomb counter of the PMIC device of FIG. 2.

Referring now to FIG. 3, there is illustrated a simplified block diagram of an example of a part of the Coulomb counter 205. The Coulomb counter 205 comprises a voltage metering module 300 which, in the illustrated example, comprises a resistance/capacitance (RC) filter component 310, which in the illustrated example comprises a single pole RC filter, arranged to receive as a differential input signal the voltage signal 305 across the sense resistance 210. The RC filter component 310 is arranged to perform filtering of the differential voltage signal 305 generated across the sense resistance 210 by the flow of current there through; the differential voltage signal 305 generated by the sense resistance 210 being representative of the current flow there through. The RC filter 310 provides a form of 'memory' that enables the fast input transients to be captured whilst enabling a sampling and operating frequency of the Coulomb counter 205 to be kept low. In the illustrated example, the RC filter 310 may be implemented by way of an external capacitor and integrated resistances.

The RC filter 310 outputs a filtered differential voltage signal 320, which is provided to an analogue to digital converter (ADC) component 330 of the voltage metering module 300. In the illustrated example, the ADC component 330 comprises a first order incremental converter. As described in greater detail below with reference to FIG. 8, the first order incremental converter of the illustrated example comprises a switched capacitor sampling network 340 arranged to sample a voltage signal received at an input 342 thereof, an integrator component 350 arranged to perform integration of voltage signals sampled by the sampling network 340 to generate an integrated sampled voltage signal VS(k) 355, and a comparator component 360 arranged to receive the integrated sampled voltage signal VS(k) 355 generated by the integrator component 350, and to output a digital signal (a(k)) 365 based at least partly on the received integrated sampled voltage signal VS(k) 355. The first order incremental converter 330 further comprises a switching arrangement 370 controllable to selectively couple the input 342 of the sampling network 340 to one of the filtered differential voltage signal (VIN) 320 and a reference voltage signal (VREF) 375. The switching arrangement 370 is further controllable to selectively configure the polarity of the reference voltage signal VREF 375 based at least partly on a logical state of a digital signal a(k) 365 output by the comparator component 360.

A control and post processing module 380, which in the illustrated example is implemented within a digital domain, is arranged to control the switching arrangement 370 and the sampling network 340, and to receive the digital signal a(k) 365 output by the comparator component 360. In the illustrated example, the digital signal a(k) 365 output by the comparator component 360 is provided to an up/down counter within the control and post processing module 380, which is arranged to update a counter value Qd(k) based on the received digital signal a(k) 365. In this manner, the voltage across the sense resistor 210 may be metered by updating the counter value Qd(k) in response to the digital signal a(k) 365 output by the ADC component 330.

Figure 4:
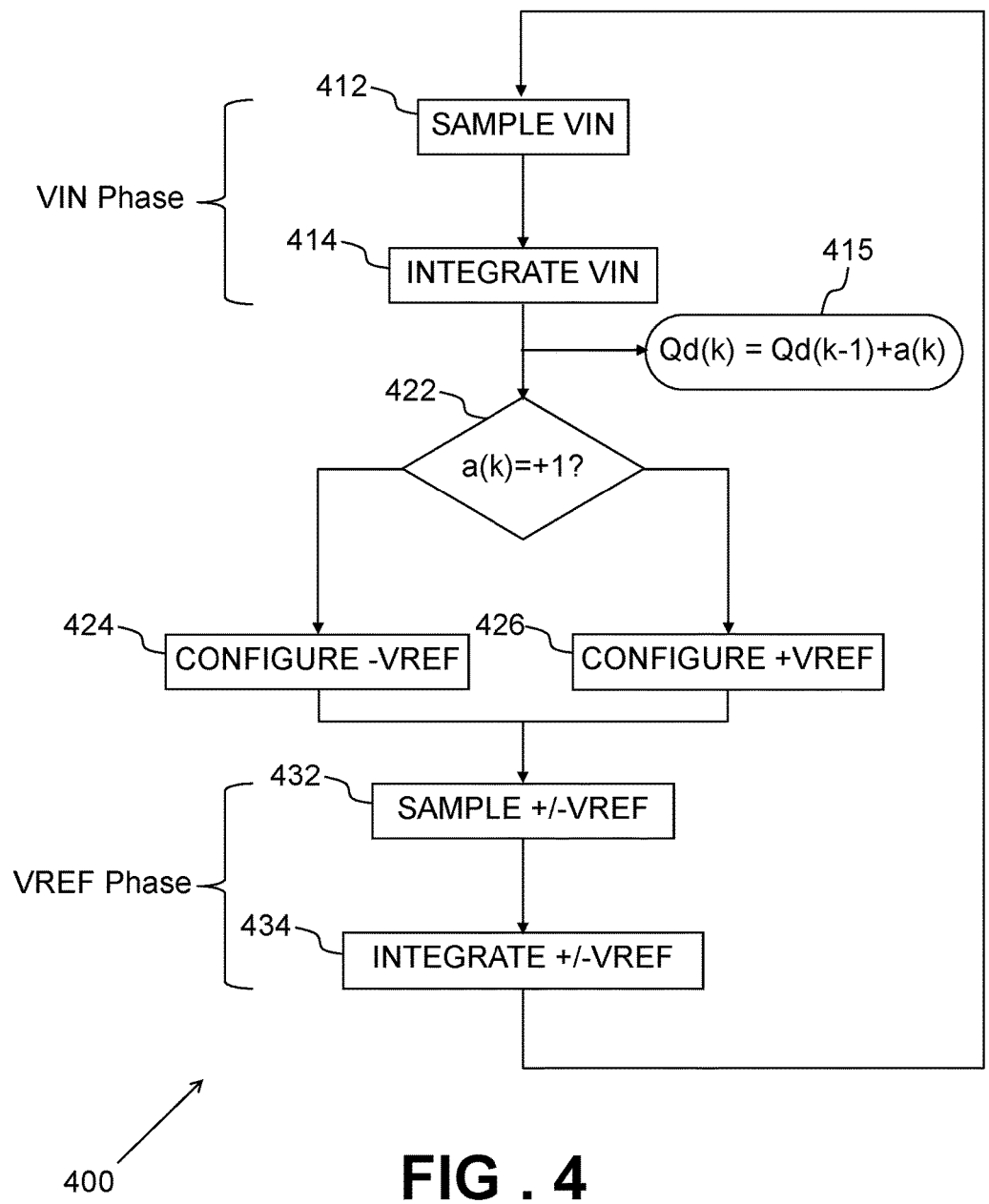
FIG. 4 illustrates a simplified flowchart of an example of a method of metering a voltage signal.

Referring now to FIG. 4, there is illustrated a simplified flowchart 400 of an example of a method of metering a voltage signal implemented by the voltage metering module 300 illustrated in FIG. 3.

The method starts with a first (VIN) phase 410 in which a differential voltage signal to be metered is sampled. For example, during such a phase the voltage metering module 300 may be configured to operate in a first operational phase whereby the control and post processing module 380 configures the switching arrangement 370 to operably couple the input 342 of the sampling network 340 to the filtered differential voltage signal 320.

Whilst in such a first (VIN) operational phase 410, the method comprises sampling an input differential voltage signal VIN, at 412. For example, in the example illustrated in FIG. 3, the control and post processing module 380 may configure the sampling network 340 into a first, sampling mode. In the illustrated example, this may be achieved by configuring a first set of switches (P1) of the sampling network into a closed configuration (i.e. whereby they provide a substantially closed circuit) such that the input voltage signal (e.g. the filtered differential voltage signal 320 in the first (VIN) operational phase 410) is applied to a capacitance 345 of the sampling network 340. In this manner, the capacitance 345 is charged by, and thus samples, the filtered differential voltage signal 320. In this first, sampling mode of the sampling network 340 a second set of switches (P2) are configured into an open configuration (i.e. whereby they provide a substantially open circuit).

Referring back to FIG. 4, having sampled the input voltage signal VIN at 412, the method moves on to 414 where (whilst still in the first, VIN phase 410) the sampled voltage signal VIN is integrated with previously sampled voltage signals. For example, referring back to FIG. 3, the control and post processing module 380 may configure the sampling network 340 into a second, integration mode. In the illustrated example, this may be achieved by configuring the first set of switches (P1) of the sampling network 340 into an open configuration and the second set of switches (P2) of the sampling network 340 into a closed configuration such that the capacitance 345 is isolated from the input voltage signal (e.g. the filtered differential voltage signal 320 in the first (VIN) operational phase 410) and operably coupled to the integrator component 350. The integrator component 350 may then perform integration of the sampled voltage across the capacitance 345; the resulting integrated sampled voltage signal being output by the integrator component 350 to the comparator component 360. As previously mentioned, the comparator component 360 is arranged to receive the integrated sampled voltage signal generated by the integrator component 350, and to output a digital signal a(k) 365 based at least partly on the received integrated sampled voltage signal.

Referring back to FIG. 4, having integrated the sampled voltage at 414, a counter value is updated in accordance with the digital signal a(k) 365 output by the comparator component 360. For example, referring back to FIG. 3, the up/down counter within the control and post processing module 380 may be incremented or decremented according to the logical state of the digital signal a(k) 365.

Referring back to FIG. 4, having integrated the sampled voltage at 414, the method additionally moves on to 422 where a logical state of the digital signal a(k) 365 output by the comparator component 360 is determined, and a polarity of the reference voltage signal 375 is configured at 424, 426 according to the determined logical state of the digital signal a(k) 365. In the illustrated example, if the digital signal a(k) 365 output by the comparator component 360 comprises a high logical state, for example a logical '+1', the reference voltage signal 375 is configured to comprise a negative polarity. Conversely, if the digital signal a(k) 365 output by the comparator component 360 comprises a low logical state, for example a logical '0' or '−1', the reference voltage signal 375 is configured to comprise a positive polarity. For example, referring back to FIG. 3, the switching arrangement 370 may be arranged to receive the digital signal a(k) 365 output by the comparator component 360 and to select a reference voltage signal polarity 375 based on the received digital signal a(k) 365.

Referring back to FIG. 4, having configured the polarity of the reference voltage signal 375 at 424, 426, the method then moves on to a second (VREF) phase 430. For example, during such a phase the voltage metering module 300 may be configured to operate in a second operational phase whereby the control and post processing module 380 configures the switching arrangement 370 to operably couple the input of the sampling network 340 to the reference signal 375 (comprising the appropriate polarity as configured at 424, 426).

Whilst in such a second (VREF) operational phase 430, the method comprises sampling the reference voltage signal VREF, at 432. For example, in the example illustrated in FIG. 3, the control and post processing module 380 may configure the sampling network 340 into the first, sampling mode, such that the reference voltage 375 is applied to a capacitance 345 of the sampling network 340. In this manner, the capacitance 345 is charged by, and thus samples, the reference voltage signal 375.

Referring back to FIG. 4, having sampled the reference voltage signal VREF at 432, the method moves on to 434 where (whilst still in the second, VREF phase 430) the sampled voltage signal VREF is integrated with previously sampled voltage signals. For example, referring back to FIG. 3, the control and post processing module 380 may configure the sampling network 340 into the second, integration mode in which the integrator component 350 may perform integration of the sampled voltage across the capacitance 345. Having integrated the reference signal, at 434, the method cycles back to 412.

In the illustrated example, there is a single comparator decision within one cycle whereby the counter value is updated in accordance with the digital signal a(k) 365 output by the comparator component 360 (a cycle being one VIN phase 410 plus one VREF phase 430). In this manner, the digital signal a(k) 365 is added to the previous value of the counter at the end of the VIN phase 410.

This general implementation of a Coulomb counter is illustrated and described in greater detail in U.S. Pat. No. 7,358,743, which is incorporated herein by reference in its entirety. Accordingly, the more specific details of its operation and functionality need not be described in any greater detail herein.

Figure 5:
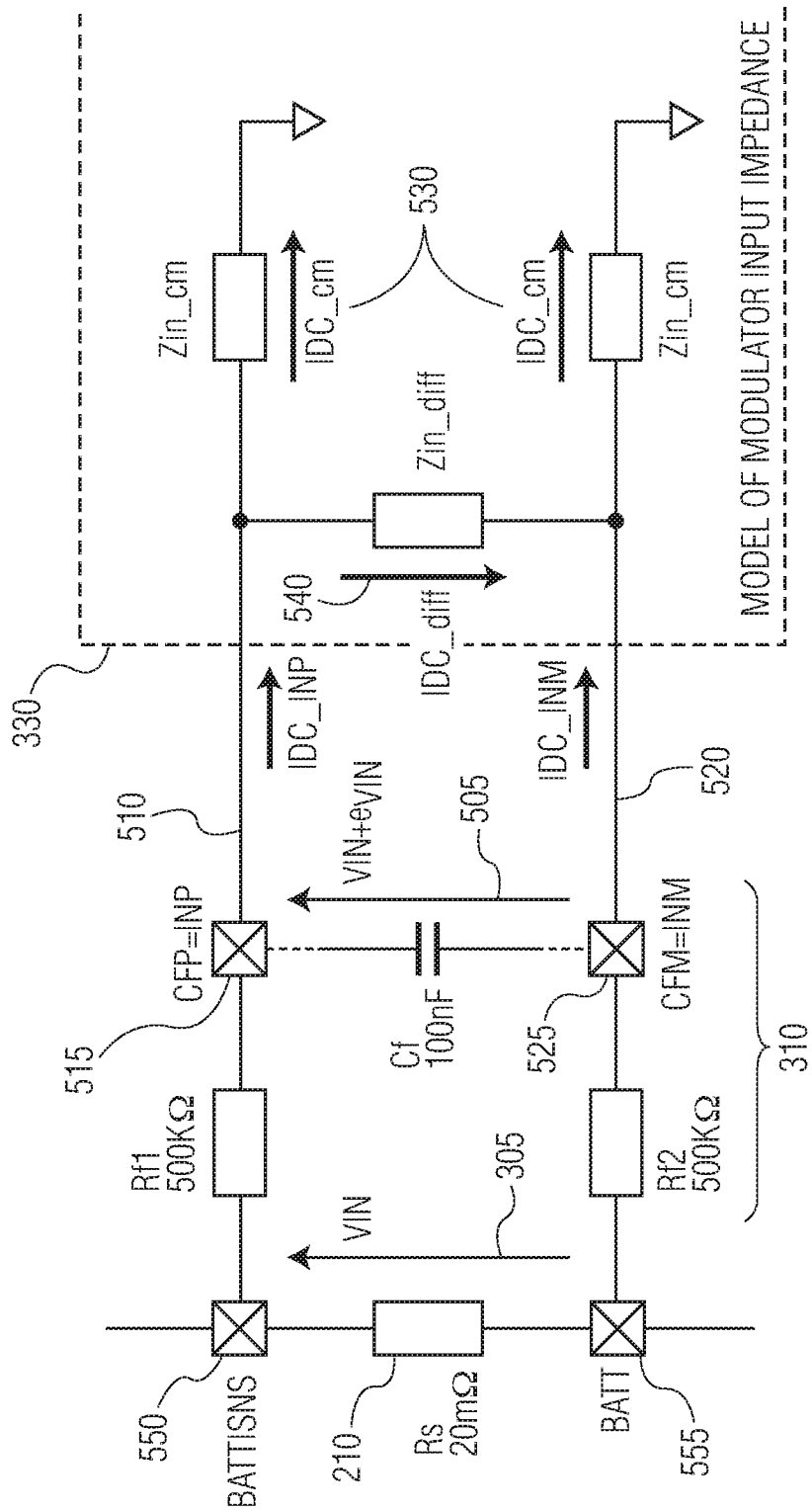
FIG. 5 illustrates a simplified circuit diagram showing input currents of an analogue to digital convert (ADC) component of the Coulomb counter of FIG. 3.

As identified in the background of the invention, for the next generation of devices external components are required to be greatly reduced or even removed, while keeping the converter bandwidth approximately constant. Consequently, the integrated resistors within the RC filter component 310 are required to be significantly larger to compensate for the reduction of the external capacitance (or its removal and replacement by a smaller integrated capacitor) in the prior art example illustrated in FIG. 1. However, the required high value input resistances result in the filter component 310 introducing a significant input voltage error resulting from input currents of the ADC component 330. FIG. 5 illustrates a simplified circuit diagram showing the input currents INP 510 and INM 520 of the ADC component 330. Any differential component, (INP-INM)/2, of the converter input current creates an input voltage error ($e_{VIN}$) at the differential input of the ADC converter 330 as it flows through the differential filter resistances (2×500K in the illustrated example). The common-mode component of the input current also contributes to the input voltage error in the case of mismatch between filter resistances.

The ADC converter input currents INP 510 and INM 520 have two origins: (i) sub-threshold currents in MOS (metal oxide semiconductor) input switches connected to the input nodes CFP 515 and CFM 525 of the ADC converter 330; and (ii) a systematic input current. The sub-threshold currents in the MOS input switches connected to the input nodes CFP 515 and CFM 525 of the ADC converter 330 may easily be eliminated using bootstrapped clocks or higher threshold voltage p-channel switches. However, the systematic input current is present even when ideal switches are used.

The differential input currents INP 510 and INM 520 may be split into a common-mode component $Idc_{CM}$, illustrated at 530 in FIG. 5, and a differential component $Idc_{DIFF}$, illustrated at 540 in FIG. 5. These two components of the input currents INP 510 and INM 520 may be expressed as:

$$Idc_{CM} = \frac{Idc_{INP} + Idc_{INM}}{2} \quad \text{[Equation 2]}$$

for the common-mode component 530, and $$Idc_{DIFF} = \frac{Idc_{INP} - Idc_{INM}}{2} \quad \text{[Equation 3]}$$

for the differential component 540.

The differential input currents INP 510 and INM 520 drawn during the VIN phase 410 (sampling and integration) are different depending on whether the reference signal during the preceding VREF phase 430 was configured to have a positive or negative polarity, because the initial voltage stored on the sampling capacitance 345 will be different depending on the polarity of the reference current.

The use of the digital signal a(k) 365 output by the comparator component 360 to configure the polarity of the reference voltage signal VREF 375 provides a feedback loop comprising sigma-delta characteristics to the ADC component 330, imparting a periodic pattern to the bitstream of the digital signal a(k) 365 output by the comparator component 360, and thus to the configuration of the polarity of the reference voltage signal VREF 375. The input currents INP 510 and INM 520 exhibit a periodic pattern similar to that of the bitstream of the digital signal a(k) 365 as a result of the sigma-delta characteristics of the feedback loop.

The average value of the periodic pattern of the input currents INP 510 and INM 520 can be calculated by a simple weighted average over the pattern length:

$$Idc_{CM} = \frac{N^{+VREF}}{N} \cdot Icycle_{CM}^{+VREF} + \frac{N^{-VREF}}{N} \cdot Icycle_{CM}^{-VREF} \quad \text{[Equation 4]}$$

for the common-mode component 530, AND $$Idc_{DIFF} = \frac{N^{+VREF}}{N} \cdot Icycle_{DIFF}^{+VREF} + \frac{N^{-VREF}}{N} \cdot Icycle_{DIFF}^{-VREF} \quad \text{[Equation 5]}$$

for the differential component 540, where:
N is the total number of cycles over the pattern length;
$N^{+VREF}$ is the number of cycles for which the reference voltage signal VREF 375 comprises a positive polarity;
$N^{-VREF}$ is the number of cycles for which the reference voltage signal VREF 375 comprises a negative polarity;
$Icycle^{+VREF}$ is the input current drawn during a VIN phase 410 following a VREF phase 430 where the reference voltage signal VREF 375 comprising a positive polarity was integrated; and
$Icycle^{-VREF}$ is the input current drawn during a VIN phase 410 following a VREF phase 430 where the reference voltage signal VREF 375 comprising a negative polarity was integrated.

The common-mode and differential components of $Icycle^{+VREF}$ may be expressed as:

$$Icycle_{CM}^{+VREF} = \frac{Icycle_{INP}^{+VREF} + Icycle_{INM}^{+VREF}}{2} \quad \text{[Equation 6]}$$

$$Icycle_{DIFF}^{+VREF} = \frac{Icycle_{INP}^{+VREF} - Icycle_{INM}^{+VREF}}{2} \quad \text{[Equation 7]}$$

Figure 6:
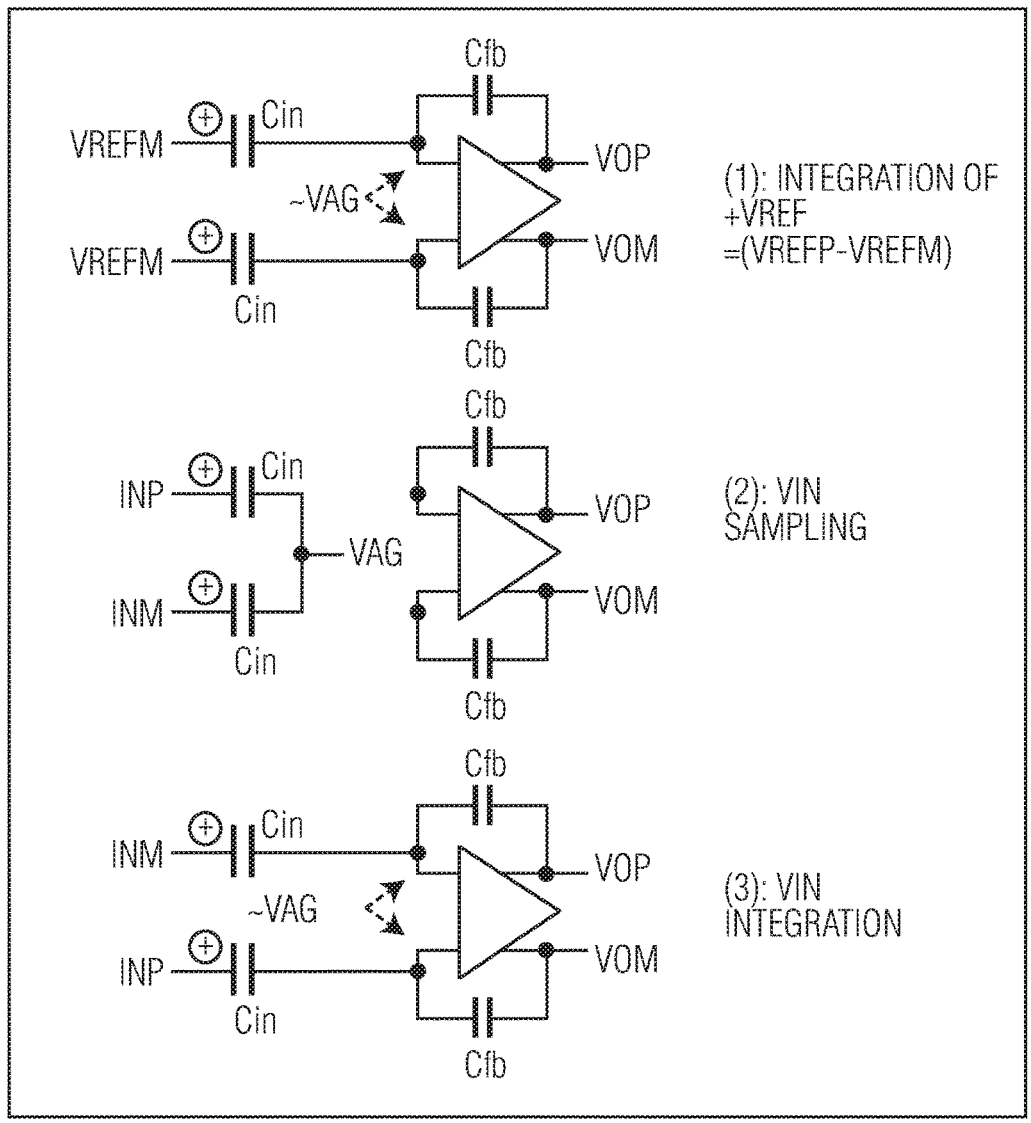
FIG. 6 illustrates simplified schematics for current flow within a sampling capacitance of the ADC component of FIG. 5.

FIG. 6 illustrates simplified schematics for the current flow within the sampling capacitance 345 in the case where the reference voltage signal VREF 375 comprises a positive polarity. During the VREF phase 430, the reference voltage signal VREF 375 comprising a positive polarity (+VREF) is stored on the sampling capacitance 345 during sampling, and an inverted (i.e. negative) reference voltage (−VREF) is stored during integration (due to cross-sampling). During the subsequent VIN phase 410, the input differential voltage signal VIN 320 is stored on the sampling capacitance 345 during sampling, and an inverted input differential voltage signal VIN 320 is stored during integration. Thus, the charge flow at each differential input of the ADC component 330 during a complete cycle of the ADC component 330 may be expressed as:

$$Q_{INP} = Q_{INPs} + Q_{INPi} = C_{in} \cdot (INP - VREFM) + C_{in} \cdot (INP - INM) \quad \text{[Equation 8]}$$

$$Q_{INM} = Q_{INMs} + Q_{INMi} = C_{in} \cdot (INM - VREFP) + C_{in} \cdot (INM - INP) \quad \text{[Equation 9]}$$

where VREFP and VREFM are the differential components of the reference voltage signal VREF 375.

Accordingly, the average input currents INP 510 and INM 520 during a cycle of the ADC component 330 when the reference voltage signal VREF 375 comprises a positive polarity may be expressed as:

$$Icycle_{INP}^{+VREF} = \frac{Q_{INP}}{T_{cycle}} = \frac{C_{in}}{T_{cycle}} \cdot (2 \cdot INP - INM - AGND) \quad \text{[Equation 10]}$$

$$Icycle_{INM}^{+VREF} = \frac{Q_{INM}}{T_{cycle}} = \frac{C_{in}}{T_{cycle}} \cdot (2 \cdot INM - INP - VREF) \quad \text{[Equation 11]}$$

In this example, VREFP=VREF and VREFM=AGND (analogue ground), for example where the reference voltage is coming from a resistor grounded on one side.

Substituting Equations 10 and 11 into Equations 6 and 7 respectively gives:

$$Icycle_{CM}^{+VREF} = \frac{C_{in}}{T_{cycle}} \cdot \left(\frac{INP + INM}{2} - \frac{VREFP + VREFM}{2}\right) \quad \text{[Equation 12]}$$

$$Icycle_{DIFF}^{+VREF} = \frac{C_{in}}{T_{cycle}} \cdot (INP - INM) + \frac{C_{in}}{2 \cdot T_{cycle}} \cdot [(INP - INM) - (VREFM - VREFP)] \quad \text{[Equation 13]}$$

For cycles where the reference voltage signal VREF 375 comprises a negative polarity, the differential components VREFP and VREFM of the reference voltage signal VREF 375 will be reversed, leading to the equations:

$$Icycle_{CM}^{-VREF} = \frac{C_{in}}{T_{cycle}} \cdot \left(\frac{INP+INM}{2} - \frac{VREFM+VREFP}{2}\right) \quad \text{[Equation 14]}$$

$$Icycle_{DIFF}^{-VREF} = \frac{C_{in}}{T_{cycle}} \cdot (INP-INM) + \quad \text{[Equation 15]}$$
$$\frac{C_{in}}{2 \cdot T_{cycle}} \cdot [(INP-INM)-(VREFP-VREFM)]$$

From Equations 12 and 14, it can be seen that the common-mode input current component is independent of the polarity of the reference voltage signal VREF 375 in the preceding VREF phase 430. As such, substituting Equations 12 and 14 into Equation 4 gives:

$$Idc_{CM} = \frac{C_{in}}{T_{cycle}} \cdot \left(\frac{INP+INM}{2} - \frac{VREFP+VREFM}{2}\right) \quad \text{[Equation 16]}$$

Substituting Equations 13 and 15 into Equation 5 for the differential input current component gives:

$$Idc_{DIFF} = \frac{C_{in}}{T_{cycle}} \cdot (INP-INM) + \frac{C_{in}}{2 \cdot T_{cycle}} \cdot \bigg[(INP-INM) - \quad \text{[Equation 17]}$$
$$\frac{N^{-VREF} - N^{+VREF}}{N} \cdot (VREFP-VREFM)\bigg]$$

Looking first at the common-mode component of the differential input current, the first term in Equation 16 inside the parenthesis represents the common-mode component of the input differential voltage signal VIN 320. The second term in Equation 16 inside the parenthesis represents the common-mode component of the reference voltage signal VREF 375. Conventionally, the reference voltage signal VREF 375 is generated with the lower value component (VREFM) equal to ground and the upper value component (VREFP) equal to, say, 120 mV. This results in a common-mode voltage equal to 60 mV. This is significantly different from a typical common-mode voltage of the input differential voltage signal VIN 320, which typically lies between 3V and 4V during a normal battery cycle of charge/discharge. Such a disparity between the common-mode voltage of the input differential voltage signal VIN 320 and the common-mode voltage of the reference voltage signal VREF 375 leads to a significant common-mode component of the differential input current.

Accordingly, in some examples it is proposed to centre the differential reference voltage signal VREF 375 around the common-mode voltage of the input differential voltage signal VIN 320. In this manner, the reference voltage signal VREF 375 will comprise a common-mode voltage substantially equal to that of the input differential voltage signal VIN 320. Referring back to Equation 16, by arranging the reference voltage signal VREF 375 to comprise a common-mode voltage substantially equal to that of the input differential voltage signal VIN 320, the two terms inside the parenthesis will cancel each other out, resulting in a common-mode component of the differential input current of substantially zero.

Figure 7:
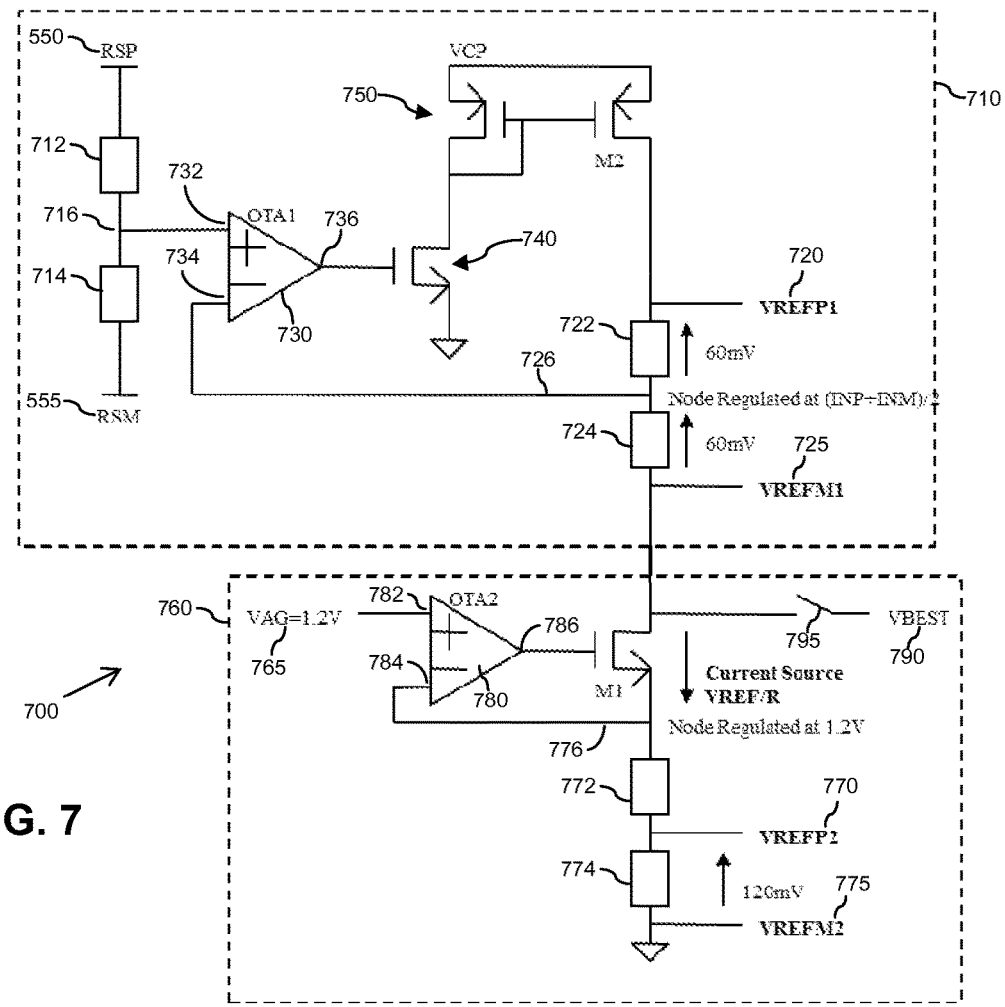
FIG. 7 illustrates a simplified circuit diagram of an example of a reference voltage generation module.

FIG. 7 illustrates a simplified circuit diagram of an example of a reference voltage generation module 700 for generating a reference voltage signal VREF 375 centred around the common-mode voltage of the input differential voltage signal VIN 320.

In the illustrated example, the reference voltage generation module 700 comprises a first component 710 arranged to generate a differential reference voltage signal VREF 375 across a first set of reference voltage signal nodes, VREFP1 720 and VREFM1 725 during normal operation, for example when the battery voltage is between 3V and 4.2V. The first component 710 of the reference voltage generation module 700 senses the input common-mode voltage before the RC filter 310, at low impedance nodes RSP, RSM, indicated at 550, 555 in FIG. 5, to avoid creating a new source of differential input current and voltage error. This can be done because the RC filter 310 does not alter the common-mode of the input signal. In particular, in the example illustrated in FIG. 7, the voltage across the low impedance nodes RSP 550 and RSM 555, which comprises the voltage across the sense resistance 210, is applied across a first potential divider comprising resistances 712, 714. By matching the resistances 712, 714, the input common-mode voltage is obtained and output by the first potential divider at 716. The sensed input common-mode voltage 716 is provided to a first (non-inverting) input 732 of a first operational transconductance amplifier OTA1 730.

A second potential divider comprising matched resistances 722, 724 is operably coupled between the first set of reference voltage signal nodes, VREFP1 720 and VREFM1 725. In this manner, the common-mode voltage of the reference voltage signal output by the first set of reference voltage signal nodes, VREFP1 720 and VREFM1 725 is obtained and output by the second potential divider at 726. The common-mode voltage of the reference voltage signal 726 output by the first set of reference voltage signal nodes, VREFP1 720 and VREFM1 725 is provided to a second (inverting) input 734 of the first operational transconductance amplifier OTA1 730.

An output 736 of the first operational transconductance amplifier OTA1 730 is arranged to control current flow through the resistances 722, 724 of the second potential divider, via a transistor device 740 and a current mirror arrangement 750. Specifically, the first operational transconductance amplifier OTA1 730 is arranged to control current flow through the resistances 722, 724 of the second potential divider such that the voltage 726 at the common node between the resistances 722, 724 of the second potential divider is regulated at the same voltage 716 as the common node between the resistances 712, 714 of the first potential divider. In this manner, the reference voltage signal output by the first set of reference voltage signal nodes, VREFP1 720 and VREFM1 725 is centred around the common-mode voltage voltage across the low impedance nodes RSP 550 and RSM 555, and thus centred around the common-mode voltage of the input differential voltage signal VIN 320. As a result, the common-mode voltage of the reference voltage signal output by the first set of reference voltage signal nodes, VREFP1 720 and VREFM1 725 is equal to the common-mode voltage of the input differential voltage signal VIN 320, resulting in a common-mode component of the input current of the ADC 330 being substantially zero (during normal operation).

In the case of recharging a dead battery, the battery voltage will be approximately 0V, with the application being powered by a charger block of the PMIC through the BP pin 240 (FIG. 2). In the example illustrated in FIG. 7, the reference voltage generation module 700 comprises a second component 760 arranged to generate a differential voltage signal VREF 375 across a second set of reference voltage signal nodes, VREFP2 770 and VREFM2 775 during recharging of a dead battery.

In the illustrated example, a bias voltage signal VAG 765 is provided to a first (non-inverting) input 782 of a second operational transconductance amplifier OTA2 780. An output 786 of the second operational transconductance amplifier OTA2 780 is arranged to control current flow through a third potential divider comprising resistances 772, 774. Reference voltage signal node VREFP2 770 is provided by a common node between the resistances 772, 774, whilst reference voltage signal node VREFM2 775 is operably to ground with resistance 774 operably coupled between the two reference voltage signal nodes, VREFP2 770 and VREFM2 775. A voltage 776 across the third potential divider is provided to a second (inverting) input 784 of the second operational transconductance amplifier OTA2 780.

In this manner, the second operational transconductance amplifier OTA2 780 is arranged to control current flow through the resistances 772, 774 of the third potential divider such that the voltage 776 across the resistances 772, 774 is regulated at the same voltage bias voltage signal VAG 765, which in the illustrated example comprises 1.2V. By providing an appropriate ratio between the resistances 772, 774 (e.g. a ratio of 9:1), a required reference voltage VREF may be achieved across the resistance 774 (e.g. of 120 mV in the illustrated example).

In some examples, in the case of a low battery, the regulation of the common-mode of the reference voltage VREF to the common-mode of the nodes RSP 550 and RSM 555 may be less than ideal. For example, when the battery is so low that the first operational transconductance amplifier OTA1 730 and other circuits are not able to operate correctly, then the first component 710 of the reference voltage generation module 700 may be disabled, whilst the second component 760 remains active. The ADC component 330 then takes the reference voltage VREF at VREFP2 770 and VREFM2 775 nodes. The common-mode of this reference voltage is low (e.g. 60 mV). When the battery is really discharged and its voltage is close to 0V, both common-mode voltages are therefore reasonably close. When the battery voltage is a little higher, say 1V, but not as high as required by the first operational transconductance amplifier OTA1 730 to achieve proper operation and consequently only the second component 760 of the reference voltage generation module 700 is active, then the common mode voltages of the nodes RSP 550 and RSM 555 and the reference voltage VREF are significantly different. This results in a non-negligible common-mode input current drawn by the ADC component 330, which can create an input voltage error if the filter resistances are mismatched. However, in such a case of deeply depleted battery, the accuracy requirements for the Coulomb Counter are not as severe, because the system may typically be required to perform a full charge to reinitialize the algorithm of state-of-charge prediction.

A voltage signal VBEST 790 is created as the highest voltage between the battery voltage and the voltage at the BP pin 240 (FIG. 2), and supplies the second component 760 of the reference voltage generation module 700 to create the reference voltage across the reference voltage signal nodes VREFP2 770 and VREFM2 775. During normal operation (i.e. when the differential reference voltage signal VREF 375 is generated across the first set of reference voltage signal nodes VREFP1 720 and VREFM1 725), a switch 795 is opened so that the voltage signal VBEST 790 does not interfere with the first component 760 of the reference voltage generation module 700.

Looking now at the differential component of the input voltages INP 510 and INM 520, which is defined in Equation 17 above, the averaging property of the sigma-delta characteristics of the feedback loop leads to:

$$\frac{Dout}{N} = \frac{INP - INM}{VREFP - VREFM} \qquad \text{[Equation 18]}$$

where $Dout = N^{-VREF} - N^{+VREF}$.

As such, the second term in Equation 17 is effectively null over a complete sigma-delta periodic pattern. As such, over a complete sigma-delta periodic pattern for the ADC component 330, the average differential component of the input current may be expressed as:

$$Idc_{DIFF\_av} = \frac{C_{in}}{T_{cycle}} \cdot (INP - INM) \qquad \text{[Equation 19]}$$

According to some aspects of the invention, it is proposed to provide one or more compensation networks operably coupled in parallel with, in the illustrated example of FIG. 3, the sampling network 340 and controllable to sample the received differential input voltage signal 320 such that an input current of the compensation network at least partially compensates for this differential component of the input current of the sampling network 340.

Figure 8:
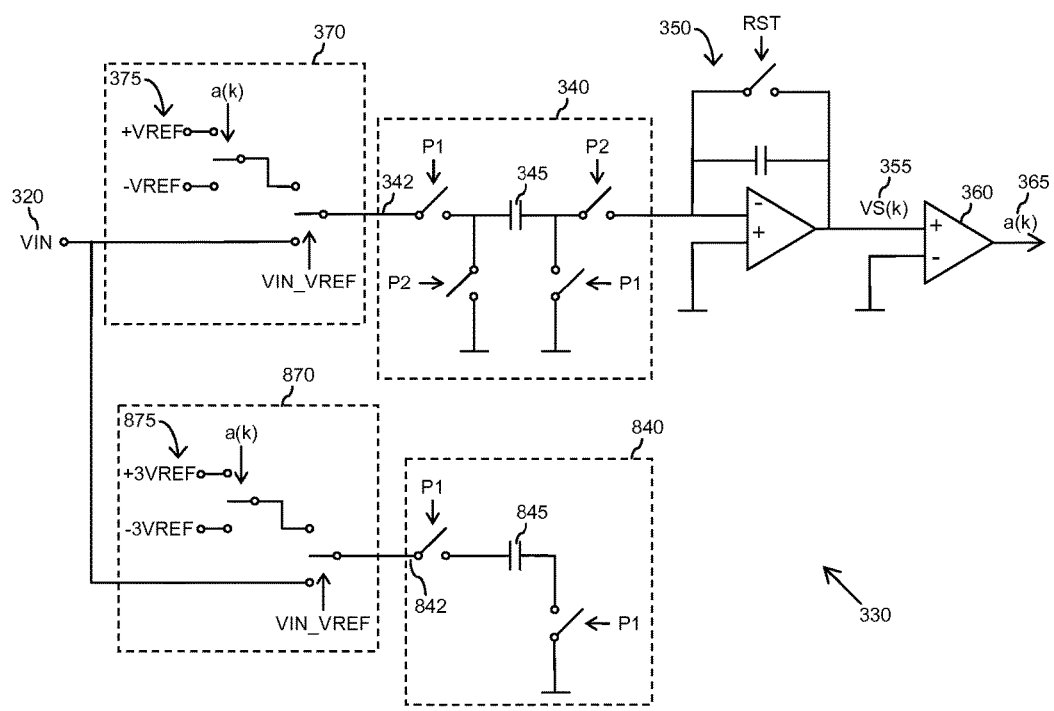
FIG. 8 illustrates a simplified circuit diagram of an example of the ADC component of FIG. 3 comprising a compensation network.

Referring now to FIG. 8, there is illustrated a simplified circuit diagram of an example of the ADC component 330 of FIG. 3 comprising such a compensation network 840. As previously described with reference to FIG. 3, the ADC component 330 comprises a switched capacitor sampling network 340 arranged to sample a voltage signal received at an input 342 thereof, an integrator component 350 arranged to perform integration of voltage signals sampled by the sampling network 340 to generate an integrated sampled voltage signal VS(k) 355, and a comparator component 360 arranged to receive the integrated sampled voltage signal VS(k) 355 generated by the integrator component 350, and to output a digital signal (a(k)) 365 based at least partly on the received integrated sampled voltage signal VS(k) 355.

The ADC component 330 further comprises a first switching arrangement 370 controllable by way of a phase select signal VIN_VREF to selectively couple the input 342 of the sampling network 340 to one of the filtered differential voltage signal (VIN) 320 and a reference voltage signal (VREF) 375. In this manner, the first switching arrangement 370 is arranged to operably couple the input 342 of the sampling network 340 to the differential input voltage signal VIN 320 received at the input of the ADC component 330 when the ADC component 330 is in a first, VIN operational phase (410 in FIG. 4), and to operably couple the input 342 of the sampling network 340 to the first differential reference voltage signal VREF 375 when the ADC component 330 is in a second, VREF operational phase (430 in FIG. 4).

The switching arrangement 370 is further controlled by way of the digital signal (a(k)) 365 to selectively configure the polarity of the reference voltage signal VREF 375.

In the example illustrated in FIG. 8, the ADC component 330 further comprises a compensation network 840 operably coupled in parallel with the sampling network 340 and controllable to sample the differential input voltage signal VIN 320 received at the input of the ADC component 330 such that an input current of the compensation network 840 at least partially compensates for a differential component of an input current of the sampling network 340. A second switching component 870 is controllable by way of a phase select signal VIN_VREF to selectively couple an input 842 of the compensation network 840 to one of the filtered differential voltage signal (VIN) 320 and a second reference voltage signal 875. In this manner, the second switching arrangement 870 is arranged to operably couple the input 842 of the compensation network 840 to the differential input voltage signal VIN 320 received at the input of the ADC component 330 when the ADC component 330 is in the first, VIN operational phase (410 in FIG. 4), and to operably couple the input 842 of the compensation network 840 to the second differential reference voltage signal 875 when the ADC component 330 is in a second, VREF operational phase (430 in FIG. 4).

The second switching arrangement 870 is also controlled by way of the digital signal (a(k)) 365 to selectively configure the polarity of the second reference voltage signal 875. In the illustrated example, the second differential reference voltage signal 875 comprises a magnitude three times the magnitude of the first differential reference voltage signal 375, and may also be centred around the common-mode voltage of the differential input voltage signal VIN 320.

As previously described with reference to FIGS. 3 and 4, the sampling network 340 is configurable into a first, sampling mode. In the illustrated example, this is achieved by configuring a first set of switches (P1) of the sampling network 340 into a closed configuration (i.e. whereby they provide a substantially closed circuit) such that the input voltage signal (e.g. the filtered differential voltage signal 320 in the first (VIN) operational phase 410) is applied to capacitance 345 of the sampling network 340. In this manner, the capacitance 345 is charged by, and thus samples, the filtered differential voltage signal 320. In this first, sampling mode of the sampling network 340 a second set of switches (P2) are configured into an open configuration (i.e. whereby they provide a substantially open circuit).

The sampling network 340 is further configurable into a second, integration mode. In the illustrated example, this may be achieved by configuring the first set of switches (P1) of the sampling network 340 into an open configuration and the second set of switches (P2) of the sampling network 340 into a closed configuration such that the capacitance 345 is isolated from the input voltage signal (e.g. the filtered differential voltage signal 320 in the first (VIN) operational phase 410) and operably coupled to the integrator component 350.

In the example illustrated in FIG. 8, the compensation network 840 is also configurable into a first, sampling mode. In the illustrated example, this is achieved by configuring a set of switches (P1) of the compensation network 840 into a closed configuration such that the input voltage signal (e.g. the filtered differential voltage signal 320 in the first (VIN) operational phase 410) is applied to capacitance 845 of the compensation network 840. In this manner, the capacitance 845 is charged by, and thus samples, the filtered differential voltage signal 320 in the first (VIN) operational phase 410.

The compensation network 840 is further configuration into a second mode, whereby the set of switches (P1) of the compensation network 840 are configured into an open configuration. In contrast to the sampling network 340, the compensation 840 does not comprise a second set of switches, such as switches P2 of the sampling network. Thus, in this second mode the capacitance 845 is simply isolated.

In the illustrated example, the set of switches (P1) of the compensation network 840 are controlled by the same control signal as the first set of switches (P1) of the sampling network 840, and are arranged to be configured into a corresponding open or closed configuration. In this manner, the compensation network 840 is arranged to sample the voltage signal at its input 842 substantially simultaneously with the sampling network 342 sampling the voltage signal at its input 342.

Figure 9:
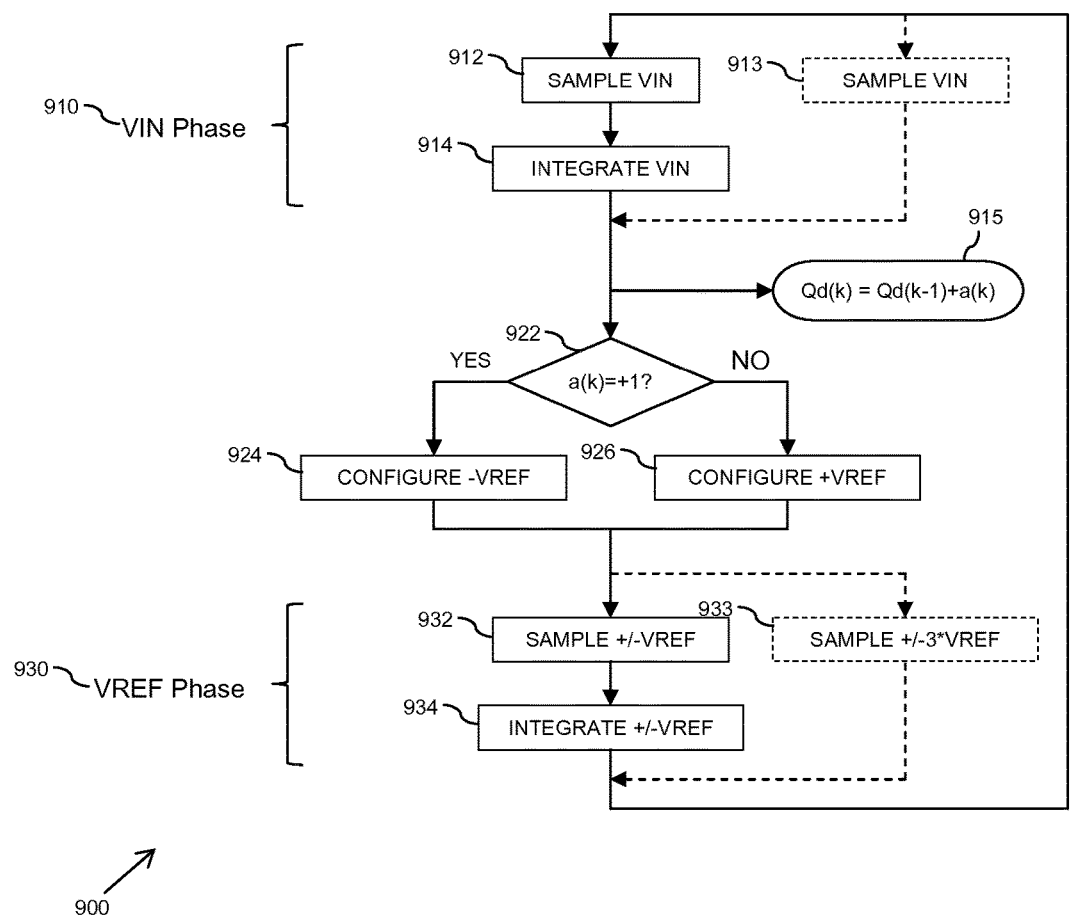
FIG. 9 illustrates a simplified flowchart of an alternative example of a method of metering a voltage signal.

Referring now to FIG. 9, there is illustrated a simplified flowchart 900 of an example of a method of metering a voltage signal implemented by the voltage metering module 300 illustrated in FIG. 3 comprising the ADC component 330 of FIG. 8.

The method starts with a first (VIN) phase 910 in which a differential voltage signal to be metered is sampled. For example, during such a phase the voltage metering module 300 may be configured to operate in a first operational phase whereby the control and post processing module 380 configures the switching arrangements 370 and 870 to operably couple the inputs 342, 842 of the sampling network 340 and compensation network 840 respectively to the filtered differential voltage signal VIN 320.

Whilst in such a first (VIN) operational phase 910, the method comprises performing a first sampling of an input differential voltage signal VIN, at 912. For example, in the example illustrated in FIG. 8, the control and post processing module 380 may configure the sampling network 340 into a first, sampling mode by configuring the first set of switches (P1) of the sampling network 340 into a closed configuration. Substantially simultaneously, the method comprises performing a second sampling of the input differential voltage signal VIN such that an input current of the second sampling of the differential voltage signal at least partially compensates for a differential input current of the first sampling of the differential voltage signal, at 913. For example, in the example illustrated in FIG. 8, the control and post processing module 380 may configure the compensation network 840 into a first, sampling mode by configuring the set of switches (P1) of the compensation network 840 into a closed configuration.

Referring back to FIG. 9, having sampled the input voltage signal VIN at 912 and 913, the method moves on to 914 where (whilst still in the first, VIN phase 910) the voltage signal VIN sampled during the first sampling of an input differential voltage signal VIN, at 912, is integrated with previously sampled voltage signals. For example, referring back to FIG. 8, the control and post processing module 380 may configure the sampling network 340 into a second, integration mode by configuring the first set of switches (P1) of the sampling network 340 into an open configuration and the second set of switches (P2) of the sampling network 340 into a closed configuration such that the capacitance 345 is isolated from the input voltage signal (e.g. the filtered differential voltage signal 320 in the first (VIN) operational phase 910) and operably coupled to the integrator component 350. The integrator component 350 may then perform integration of the sampled voltage across the capacitance 345; the resulting integrated sampled voltage signal being output by the integrator component 350 to the comparator component 360. As previously mentioned, the comparator component 360 is arranged to receive the integrated sampled voltage signal generated by the integrator component 350, and to output a digital signal a(k) 365 based at least partly on the received integrated sampled voltage signal. Additionally, the control and post processing module 380 may further configure the compensation network 840 into a second mode by configuring the set of switches (P1) of the compensation network 840 into an open configuration such that the capacitance 845 is isolated.

Referring back to FIG. 9, having integrated the sampled voltage at 914, a counter value is updated in accordance with the digital signal a(k) 365 output by the comparator component 360. For example, referring back to FIG. 3, the up/down counter within the control and post processing module 380 may be incremented or decremented according to the logical state of the digital signal a(k) 365.

Referring back to FIG. 9, having integrated the sampled voltage at 914, the method additionally moves on to 922 where a logical state of the digital signal a(k) 365 output by the comparator component 360 is determined, No, this needs to be changed (same remark as for FIG. 4)

and a polarity of the reference voltage signal 375 is configured at 924, 926 according to the determined logical state of the digital signal a(k) 365. In the illustrated example, if the digital signal a(k) 365 output by the comparator component 360 comprises a high logical state, for example a logical '+1', the reference voltage signal 375 is configured to comprise a negative polarity. Conversely, if the digital signal a(k) 365 output by the comparator component 360 comprises a low logical state, for example a logical '0' or '-1', the reference voltage signal 375 is configured to comprise a positive polarity. For example, referring back to FIG. 8, the switching arrangements 370, 870 may be arranged to receive the digital signal a(k) 365 output by the comparator component 360 and to select a polarity of their respective reference voltage signals 375, 875 based on the received digital signal a(k) 365.

Referring back to FIG. 9, having configured the polarity of the reference voltage signal 375 at 924, 926, the method then moves on to a second (VREF) phase 930. For example, during such a phase the voltage metering module 300 may be configured to operate in a second operational phase whereby the control and post processing module 380 configures the switching arrangements 370, 870 to operably couple the inputs 342, 842 of the sampling network 340 and compensation network 840 respectively to the respective reference signals 375, 875 (comprising the appropriate polarities as configured at 924, 926).

Whilst in such a second (VREF) operational phase 930, the method comprises performing a first sampling of the reference voltage signal VREF 375 for the sampling network 340, at 932. For example, in the example illustrated in FIG. 8, the control and post processing module 380 may configure the sampling network 340 into a first, sampling mode by configuring the first set of switches (P1) of the sampling network 340 into a closed configuration. Substantially simultaneously, the method comprises performing a second sampling of the reference voltage signal 875 for the compensation network 840. For example, in the example illustrated in FIG. 8, the control and post processing module 380 may configure the compensation network 840 into a first, sampling mode by configuring the set of switches (P1) of the compensation network 840 into a closed configuration.

Referring back to FIG. 9, having sampled the reference voltage signals at 932 and 933, the method moves on to 934 where (whilst still in the second, VREF phase 930) the reference voltage signal VREF 375 for the sampling network 340 sampled at 932 is integrated with previously sampled voltage signals. For example, referring back to FIG. 8, the control and post processing module 380 may configure the sampling network 340 into a second, integration mode by configuring the first set of switches (P1) of the sampling network 340 into an open configuration and the second set of switches (P2) of the sampling network 340 into a closed configuration such that the capacitance 345 is isolated from the input voltage signal (e.g. the reference voltage signal 375 in the second (VREF) operational phase 930) and operably coupled to the integrator component 350. Additionally, the control and post processing module 380 may further configure the compensation network 840 into a second mode by configuring the set of switches (P1) of the compensation network 840 into an open configuration such that the capacitance 845 is isolated.

Having integrated the reference signal, at 934, the method cycles back to 912 and 913.

Equation 17 above defines the differential input current component as a result of the sampling network 340, and a similar equation applies to the differential input current as a result of the compensation network 840. However, the first term of Equation 17 corresponds to cross-sampling in the integration mode of the sampling network 340 during the first, VIN phase 410. Because the compensation network 840 does not comprise the cross-sampling switches P2, this first term of Equation 17 does not apply to the compensation network 840. Accordingly, the differential input current component for the sampling network 840 may be expressed as:

$$Idc_{DIFF} = \frac{C_{in}}{2 \cdot T_{cycle}} \cdot \left[ (INP - INM) - 3 \cdot \frac{N^{-VREF} - N^{+VREF}}{N} \cdot (VREFP - VREFM) \right] \quad \text{[Equation 20]}$$

noting that the reference voltage signal 875 for the compensation network 840 is equal to 3*VREF (VREF being the reference voltage signal 375 for the sampling network 340). Applying the averaging property of the sigma-delta characteristics of the feedback loop (see Equation 18) to Equation 20 gives:

$$Idc_{DIFF} = \frac{C_{in}}{2 \cdot T_{cycle}} \cdot [(INP - INM) - 3 \cdot (INP - INM)] = \quad \text{[Equation 21]}$$

$$-\frac{C_{in}}{T_{cycle}} \cdot (INP - INM)$$

As can be seen from Equation 21, the average differential component of the input currents resulting from the compensation network 840 exactly compensates for the average differential component of the input currents resulting from the sampling network 340 defined in Equation 19. Accordingly, by providing a compensation network 840 configurable into a sampling mode that substantially mirrors that of the sampling network 340, but for which no cross-sampling is performed, the average differential component of the input currents resulting from the compensation network 840 is able to compensate for the average differential component of the input currents resulting from the sampling network 340. Advantageously, in the illustrated example, by providing a reference voltage signal 875 to the compensation network 840 comprising a magnitude three times that of the sampling network 340, the average differential component of the input currents resulting from the compensation network 840 is able to compensate substantially exactly for the average differential component of the input currents resulting from the sampling network 340. As a result, the differential component of the systematic input currents may be substantially cancelled out.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, some aspects of the invention are not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage metering module for metering a voltage signal, the voltage metering module comprising:
   at least one analogue to digital converter (ADC) component arranged to receive at an input thereof a voltage signal and to generate a digital signal representative of the received voltage signal, the at least one ADC component comprising:
       at least one sampling network controllable to sample the received voltage signal for conversion to a digital signal representative of the received voltage signal; and
       at least one compensation network operably coupled in parallel with the sampling network and controllable to sample the received voltage signal such that an input current of the compensation network at least partially compensates for a component of an input current of the sampling network.

2. The voltage metering module of claim 1, wherein the at least one compensation network is arranged to sample the received voltage signal simultaneously with the sampling network sampling the received voltage signal.

3. The voltage metering module of claim 2, wherein the first reference voltage comprises a differential voltage signal.

4. The voltage metering module of claim 3, wherein the first reference voltage is centered about a common-mode voltage of the received voltage signal.

5. The voltage metering module of claim 2, wherein the ADC component comprises at least one further switching component controllable to selectively couple an input of the compensation network to one of:
  (i) the voltage signal received at the input of the ADC component; and
  (ii) at least one further reference voltage signal,
  wherein the at least one further switching arrangement is arranged to:
  operably couple the input of the compensation network to the voltage signal received at the input of the ADC component when the ADC component is in a first operational phase; and
  operably couple the input of the compensation network to the at least one further reference voltage signal when the ADC component is in a second operational phase.

6. The voltage metering module of claim 5, wherein the at least one further switching arrangement is controllable to selectively configure a polarity of the at least one further reference voltage signal.

7. The voltage metering module of claim 5, wherein the at least one further reference voltage signal compromises a magnitude three times the magnitude of the first reference voltage signal.

8. The voltage metering module of claim 1, wherein the ADC component comprises a first switching arrangement controllable to selectively couple an input of the sampling network to one of:
  (i) the voltage signal received at the input of the ADC component; and
  (ii) a first reference voltage signal,
  wherein the first switching arrangement is arranged to:
  operably couple the input of the sampling network to the voltage signal received at the input of the ADC component when the ADC component is in a first operational phase; and
  operably couple the input of the sampling network to the first reference voltage signal when the ADC component is in a second operational phase.

9. The voltage metering module of claim 8, wherein the first switching arrangement is controllable to selectively configure a polarity of the first reference voltage signal.

10. The voltage metering module of claim 9, wherein the first switching arrangement is controllable to selectively configure the polarity of the first reference voltage signal based at least partly on a logical state of a digital signal representative of an integrated sampled voltage signal.

11. The voltage metering module of claim 1, wherein the ADC component further comprises an integrator component arranged to perform integration of the received voltage signals sampled by the sampling network to generate an integrated sampled voltage signal.

12. The voltage metering module of claim 11, wherein the at least one sampling network is configurable to operate in:
  a first, sampling mode in which the sampling network samples the received voltage signal; and
  a second, integration mode in which the sampled voltage signal is provided to the integrator component.

13. The voltage metering module of claim 12, wherein the at least one compensation network is controllable to operate in a sampling mode equivalent to the sampling mode of the at least one sampling network.

14. The voltage metering module of claim 11, wherein the ADC component further comprises a comparator component arranged to receive the integrated sampled voltage signal generated by the integrator component, and to output a digital signal based at least partly on the received integrated sampled voltage signal.

15. The voltage metering module of claim 1, wherein the voltage metering module comprises at least one resistance/capacitance, RC, filter component arranged to perform filtering of a voltage signal to be metered, and the at least one analogue to digital converter, ADC, component is arranged to receive the filtered voltage signal at the input thereof and to generate a digital signal representative of the filtered voltage signal.

16. The voltage metering module of claim 1, wherein the voltage metering module comprises a sense resistance operably coupled in series with a current flow path and arranged to generate a voltage signal to be metered there across representative of a current flow through the current flow path.

17. The voltage metering module of claim 1, wherein the ADC component is arranged to receive at an input thereof a differential voltage signal and to generate a digital signal representative of the received differential voltage signal; the at least one ADC component comprising:
  at least one sampling network controllable to sample the received differential voltage signal for conversion to a digital signal representative of the received differential voltage signal; and
  at least one compensation network operably coupled in parallel with the sampling network and controllable to sample the received differential voltage signal such that an input current of the compensation network at least partially compensates for a differential component of an input current of the sampling network.

18. A battery state-of-charge module comprising:
  at least one voltage metering module comprising at least one analogue to digital converter (ADC) component arranged to receive at an input thereof a voltage signal and to generate a digital signal representative of the received voltage signal, the at least one ADC component comprising:
    at least one sampling network controllable to sample the received voltage signal for conversion to a digital signal representative of the received voltage signal; and
    at least one compensation network operably coupled in parallel with the sampling network and controllable to sample the received voltage signal such that an input current of the compensation network at least partially compensates for a component of an input current of the sampling network.

19. An integrated circuit device comprising:
  at least one voltage metering module comprising at least one analogue to digital converter (ADC) component arranged to receive at an input thereof a voltage signal and to generate a digital signal representative of the received voltage signal, the at least one ADC component comprising:

at least one sampling network controllable to sample the received voltage signal for conversion to a digital signal representative of the received voltage signal; and at least one compensation network operably coupled in parallel with the sampling network and controllable to sample the received voltage signal such that an input current of the compensation network at least partially compensates for a component of an input current of the sampling network.

\* \* \* \* \*